US012750011B2

(12) United States Patent
Kaddouri et al.

(10) Patent No.: US 12,750,011 B2
(45) Date of Patent: Sep. 29, 2026

(54) AMPLIFIER WITH TEMPERATURE DEPENDENT GAIN AND TEMPERATURE COMPENSATED BANDWIDTH

(71) Applicant: STMicroelectronics International N.V., Geneva (CH)

(72) Inventors: Danilo Karim Kaddouri, Pero (IT); Francesco Borgioli, Leghorn (IT); Roberto Pio Baorda, Casarile (IT); Lorenzo Ercolini, Milan (IT)

(73) Assignee: STMicroelectronics International N.V., Geneva (CH)

( * ) Notice: Subject to any disclaimer, the term of this patent is extended or adjusted under 35 U.S.C. 154(b) by 375 days.

(21) Appl. No.: 18/409,307

(22) Filed: Jan. 10, 2024

(65) Prior Publication Data

US 2025/0226799 A1 Jul. 10, 2025

(51) Int. Cl.
*H03F 1/30* (2006.01)
*H03F 1/02* (2006.01)
*H03F 3/45* (2006.01)

(52) U.S. Cl.
CPC ........... *H03F 1/301* (2013.01); *H03F 1/0216* (2013.01); *H03F 3/45085* (2013.01); *H03F 3/45273* (2013.01); *H03F 3/45475* (2013.01)

(58) Field of Classification Search
CPC .... H03F 1/301; H03F 1/0216; H03F 3/45085; H03F 3/45273; H03F 3/45475
USPC .......................................................... 330/295
See application file for complete search history.

(56) References Cited

U.S. PATENT DOCUMENTS 8,686,617 B2 * 4/2014 Koning ................ H03K 3/3545
310/315
10,198,022 B1 * 2/2019 Far ............................ G05F 3/08
12,267,047 B2 * 4/2025 Bertolini ................. H03F 3/345
2004/0178846 A1 * 9/2004 Kuyel ................ H03F 3/45986
330/253

(Continued)

FOREIGN PATENT DOCUMENTS

CN 102664594 B * 9/2014
JP 6000884 B2 9/2016

OTHER PUBLICATIONS

David L. Cave, W. Richard Davis, A Quad JFET Wide-Band Operational-Amplifier Integrated Circuit Featuring Temperature-Compensated Bandwidth, IEEE Journal of SSC, vol. SC-2, n. 4, Aug. 1977.

(Continued)

*Primary Examiner* — Hafizur Rahman
(74) *Attorney, Agent, or Firm* — Crowe & Dunlevy LLC

(57) ABSTRACT

An operational amplifier (OPAMP) is biased with a tail current that varies with temperature and process in order to compensate for variations in amplifier bandwidth. A proportional to absolute temperature (PTAT) current source generates a PTAT current producing a reference voltage. A voltage-to-current generator circuit utilizing a differential amplifier circuit converts the reference voltage to a reference current from which the tail current is derived. Resistors coupled to the PTAT current source and the voltage-to-current generator circuit have resistance values dependent on operating temperature, wherein such resistors are matching of the resistors used for a gain setting circuit of the OPAMP.

10 Claims, 3 Drawing Sheets

(56) References Cited

U.S. PATENT DOCUMENTS

| | | | | |
|---|---|---|---|---|
| 2015/0236662 | A1* | 8/2015 | Ni | H03F 3/45932 330/258 |
| 2017/0163222 | A1 | 6/2017 | Carrara et al. | |
| 2020/0183434 | A1 | 6/2020 | Hurwitz et al. | |
| 2022/0337198 | A1* | 10/2022 | Bertolini | H03F 1/301 |
| 2022/0352858 | A1 | 11/2022 | Taschwer et al. | |
| 2024/0283412 | A1* | 8/2024 | Przyborowski | H03F 3/45991 |

OTHER PUBLICATIONS

Nenadovic, Miljana et al.: "A 32 ppm/oC temperature-compensated operational amplifier for application in medical device tracking," Analog Integr Circ Sig Process (2016), 11 pgs.

* cited by examiner

AMPLIFIER WITH TEMPERATURE DEPENDENT GAIN AND TEMPERATURE COMPENSATED BANDWIDTH

TECHNICAL FIELD

The present invention relates to an amplifier circuit and, in particular, to an amplifier circuit having temperature dependent gain with a compensated bandwidth variation.

Embodiments can be implemented, in particular, in amplification configurations including operational amplifiers and, even more specifically, operational amplifiers with temperature-dependent gain.

BACKGROUND

Reference is made to FIG. 1 showing a schematic circuit diagram for amplifier circuit 10. The circuit 10 utilizes an operational amplifier (OPAMP) 12 having an inverting (−) input, a noninverting (+) input and an output which generates an output voltage Vout. An input resistor R1 has a first terminal coupled, preferably connected, to the inverting (−) input and a second terminal coupled to receive an input signal Vin. A feedback resistor R2 has a first terminal coupled, preferably connected, to the inverting (−) input and a second terminal coupled, preferably connected, to the output. The noninverting (+) input is coupled, preferably connected, to a supply reference voltage node (for example, the ground).

The circuit 10 may be configured to exhibit a desired gain-temperature characteristic through the selection of resistances for the resistors R1 and R2 of the gain setting resistor network.

The resistor R1 has a first temperature coefficient $$C_1^T$$

with a temperature dependent resistance of:

$$R1 = R1_0(1 + C_1^T \Delta T),$$

where $\mathbf{R1_0}$ is the nominal resistance at room temperature (for example, 25° C.), ΔT is the change in temperature relative to room temperature, and $$C_1^T$$

is the thermal coefficient measured in 1/° C.

The resistor R2 has a second temperature coefficient $$C_2^T$$

with a temperature dependent resistance of:

$$R2 = R2_0(1 + C_2^T \Delta T),$$

where $\mathbf{R2_0}$ is the nominal resistance at room temperature (for example, 25° C.), ΔT is the change in temperature relative to room temperature, and $$C_2^T$$

is the thermal coefficient measured in 1/° C.

The ideal amplifier gain is given by:

$$\text{Gain} = \frac{Vout}{Vin} = -\frac{R2}{R1},$$

and is temperature dependent.

The bandwidth (unity gain-product) of the amplifier circuit 10 is given by:

$$\omega_0 = \frac{g_{m1}}{C_c}\beta = \frac{g_{m1}}{C_c}\frac{R1}{R1 + R2}$$

Where: $g_{m1}$ is the small signal transconductance of the first (input) stage of the OPAMP 12, $C_c$ is the compensation capacitance, and B is the feedback network amplification. In the context of a single stage amplifier, the compensation capacitance $C_c$ is the load capacitance at the output node of the amplifier circuit. In the context of a multi-stage amplifier, the compensation capacitance $C_c$ is the compensation capacitance within the OPAMP 12 between stage output nodes, with a load capacitor $C_{load}$ coupled to the amplifier circuit output node.

The amplifier bandwidth $\omega_0$ is accordingly temperature and process dependent (with a factor of $$\frac{R1}{R1 + R2}).$$

The small signal transconductance is temperature dependent as well.

There exists a need for the amplifier circuit to be compensated against temperature variations and process spread.

For example, the problem to be addressed concerns the development of an amplifier with low bandwidth sensitivity to temperature and process variations that overcomes the disadvantages of prior art techniques.

SUMMARY

Disadvantages of prior art solutions are overcome by implementing an amplification scheme in which an operational amplifier (OPAMP), in particular the differential input stage of the amplifier, is biased with a tail current that varies with temperature and process in order to compensate for variations in amplifier bandwidth. The amplification scheme includes: a proportional to absolute temperature (PTAT) current source to provide a PTAT current producing a reference voltage; a voltage-to-current generator circuit utilizing a differential amplifier circuit for converting the reference voltage to a reference current from which the tail current is derived; and resistors coupled to the PTAT current source and voltage-to-current generator circuit having resistance values dependent on operating temperature. These resistors are configured to match the resistors used for a gain setting circuit network of the OPAMP.

In an embodiment, an amplification circuit comprises: an operational amplifier having a first input, a second input, and an output; an input resistor having a first resistance coupled to the first input; a feedback resistor having a second resistance coupled between the output and the first input; wherein the operational amplifier includes a differential input circuit coupled to the first and second inputs and biased by a bias current; and a bias current generator circuit. The bias current generator circuit comprises: a proportional to absolute temperature (PTAT) current generator configured to generate a PTAT current; a first resistor having a resistance substantially equal to a sum of the first and second resistances; wherein the PTAT current is applied to the first resistor to generate a reference voltage; a voltage-to-current converter circuit configured to convert the reference voltage to a reference current generated as a function of a second resistor having a resistance substantially equal to the first resistance; and a mirroring circuit configured to mirror the reference current to generate said bias current.

In an embodiment, a circuit comprises: an amplifier circuit having a gain setting network formed by an input resistor and a feedback resistor; wherein said amplifier circuit includes a differential input circuit that is tail biased by a bias current; and a bias current generator circuit. The bias current generator circuit comprises: a proportional to absolute temperature (PTAT) current generator coupled in series with a first resistor to generate a reference voltage; wherein the first resistor has a temperature dependent resistance substantially equal to a sum of temperature dependent resistances of the input and feedback resistors; a voltage-to-current converter circuit configured to convert the reference voltage to a reference current applied across a second resistor; wherein the second resistor has a temperature dependent resistance substantially equal to the temperature dependent resistance of the input resistor; and a mirroring circuit configured to mirror the reference current to generate said bias current.

In an embodiment, a circuit comprises: an operational amplifier (OPAMP) with a gain setting network formed by an input resistor with a first resistance R1 and a feedback resistor with a second resistance R2; wherein said OPAMP has a bandwidth set as a function of a transconductance of an input stage of said OPAMP multiplied by a first factor equal to $$\frac{R1}{R1+R2}$$

as set by said gain setting network; wherein the transconductance is dependent on a tail current configured to bias the input stage of said OPAMP; and a bias current generator circuit configured to generate said tail current as a function of a second factor substantially equal to $$\frac{R1+R2}{R1}.$$

The second factor $$\frac{R1+R2}{R1}$$

is set by a first resistor of the bias current generator circuit having a third resistance R3 substantially equal to a sum of the first resistance R1 and second resistance R2 and by a second resistor of the bias current generator circuit having a fourth resistance R4 substantially equal to the first resistance R1.

BRIEF DESCRIPTION OF THE DRAWINGS

For the understanding of the present invention, embodiments thereof are now described, purely as a non-limitative example, with reference to the enclosed drawings, wherein.

DETAILED DESCRIPTION

Figure 1:
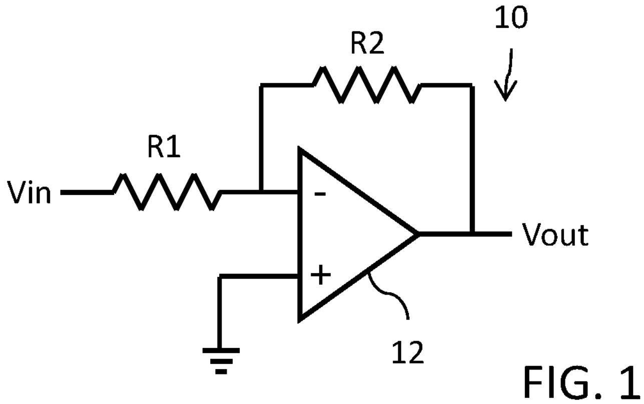
FIG. 1 is a schematic circuit diagram for amplifier circuit.
Figure 2:
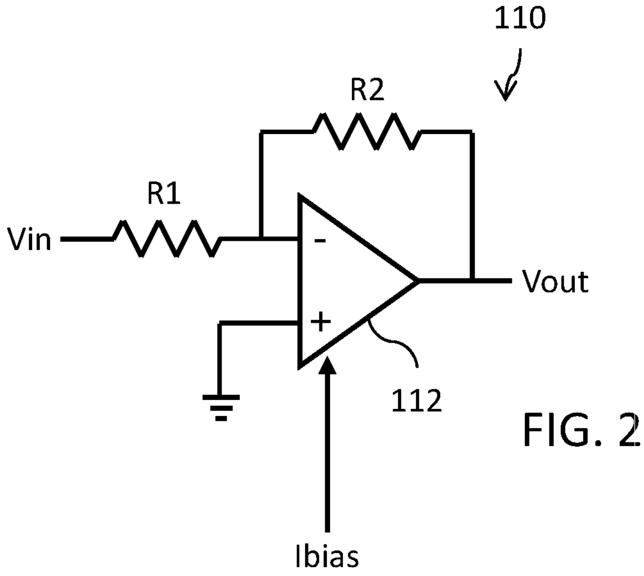
FIG. 2 is a schematic circuit diagram for amplifier circuit with bandwidth compensation.

Reference is made to FIG. 2 showing a schematic circuit diagram for amplifier circuit 110 configured to compensate the variations in amplifier bandwidth while exhibiting a temperature dependent gain. The circuit 110 utilizes an operational amplifier (OPAMP) 112 having an inverting (−) input, a noninverting (+) input and an output which generates an output voltage Vout. An input resistor R1 has a first terminal coupled, preferably connected, to the inverting (−) input and a second terminal coupled to receive an input signal Vin. A feedback resistor R2 has a first terminal coupled, preferably connected, to the inverting (−) input and a second terminal coupled, preferably connected, to the output. The noninverting (+) input is coupled, preferably connected, to a supply reference voltage node (for example, the ground).

The circuit 110 may be configured to exhibit a desired gain-temperature characteristic through the selection of resistances for the resistors R1 and R2 of the gain setting resistor network.

The resistor R1 has a first temperature coefficient $$C_1^T$$

with a temperature dependent resistance of:

$$R1 = R1_0(1 + C_1^T \Delta T),$$

where $\mathbf{R1_0}$ is the nominal resistance at room temperature (for example, 25° C.), ΔT is the change in temperature relative to room temperature, and $$C_1^T$$

is the thermal coefficient measured in 1/° C.

The resistor R2 has a second temperature coefficient $$C_2^T$$

with a temperature dependent resistance of:

$$R2 = R2_0(1 + C_2^T \Delta T),$$

where $R2_0$ is the nominal resistance at room temperature (for example, 25° C.), ΔT is the change in temperature relative to room temperature, and $$C_2^T$$

is the thermal coefficient measured in 1/° C.

The ideal amplifier gain is given by;

$$\text{Gain} = \frac{Vout}{Vn} = -\frac{R2}{R1},$$

and is temperature dependent.

To compensate for variation of amplifier bandwidth due to temperature, the OPAMP 112 is biased with a temperature and process variable bias current Ibias. More specifically, the bias current Ibias is applied as a tail current for a differential input stage of the OPAMP, and is generated as a function of resistances which match (i.e., are substantially equal, preferably equal) resistances of the gain setting resistor network of the OPAMP.

Figure 3:
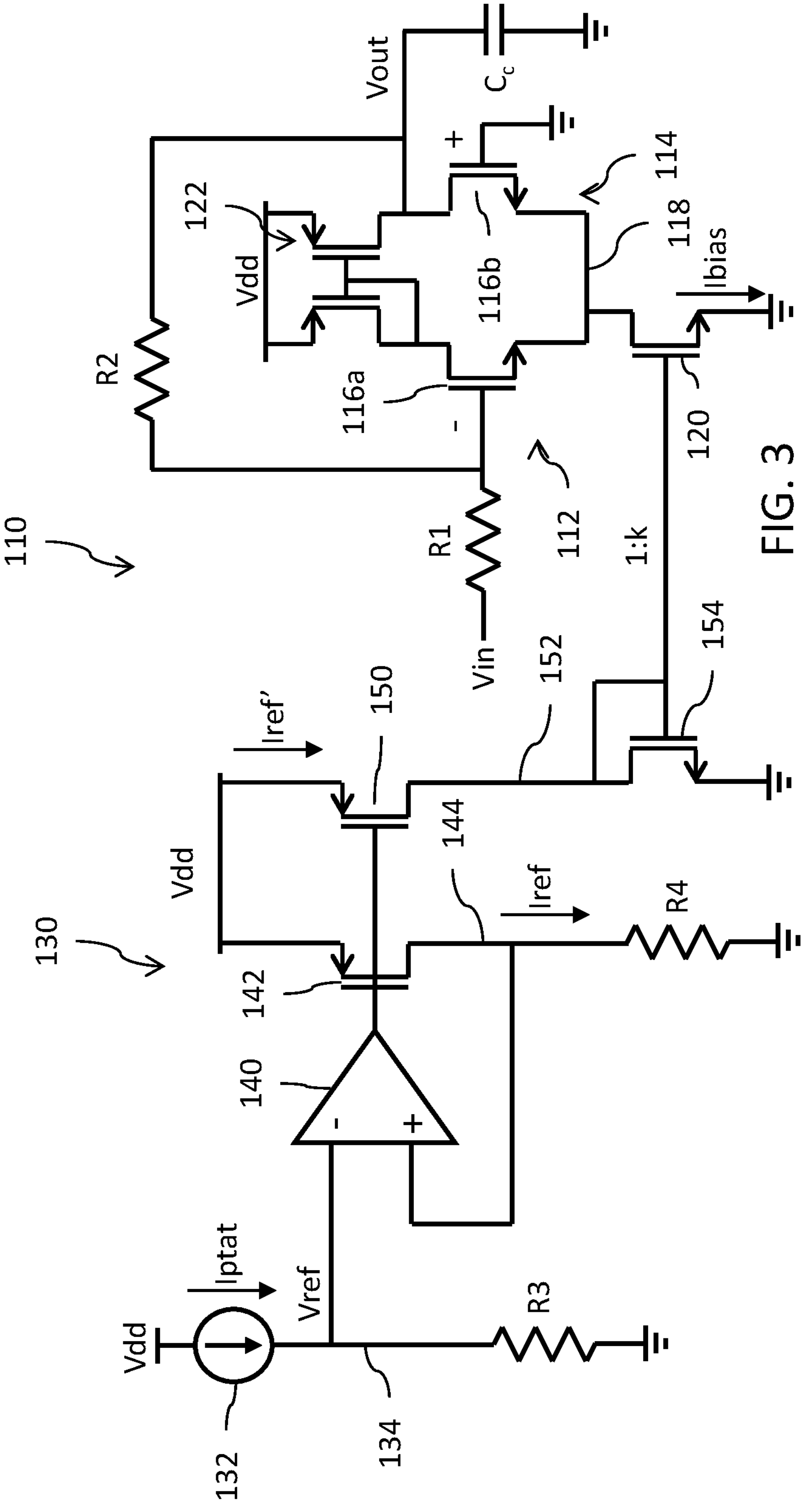
FIG. 3 is a circuit diagram illustrating circuit details for the amplifier circuit with bandwidth compensation as shown in FIG. 2.
Figure 4:
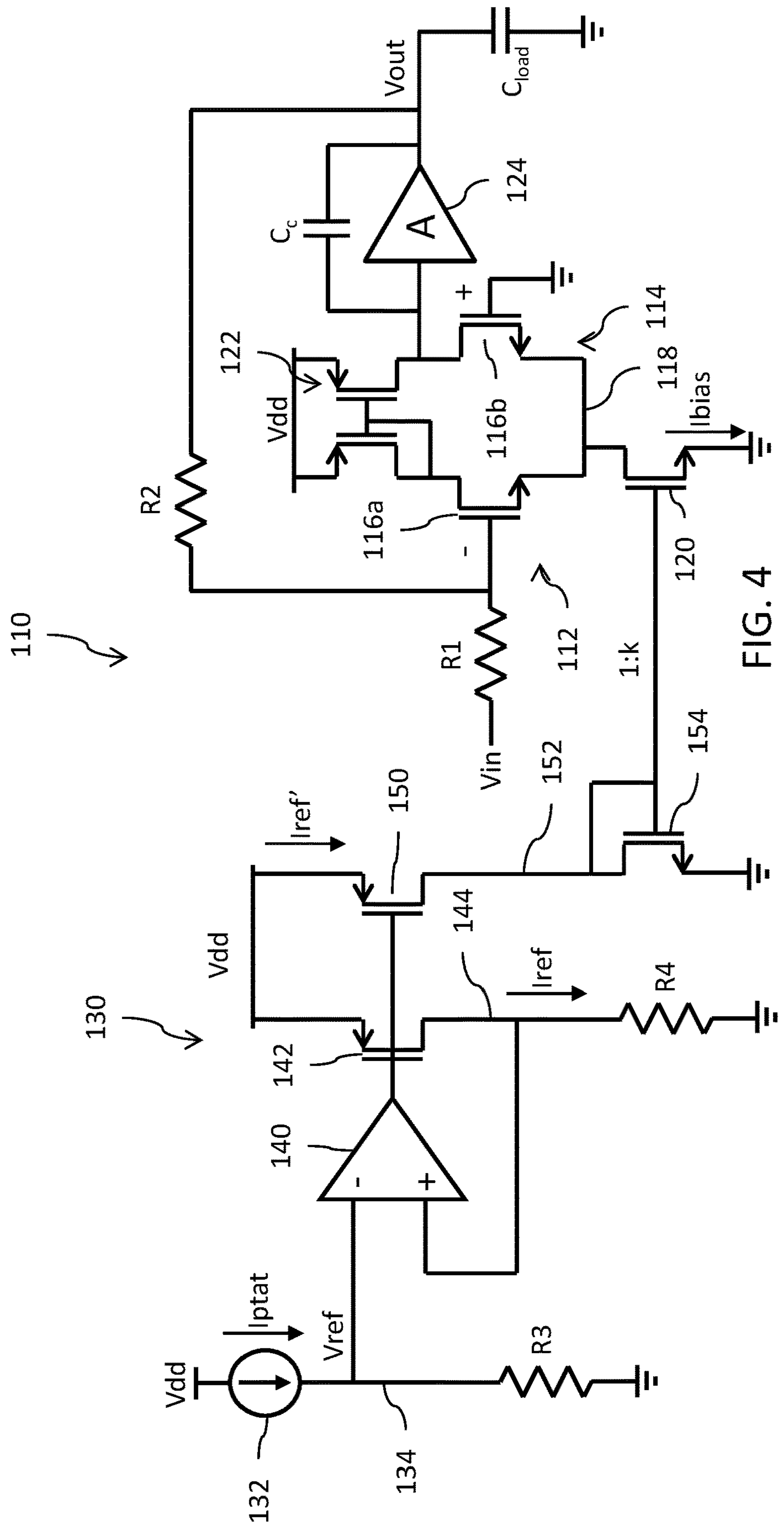
FIG. 4 is a circuit diagram illustrating circuit details for the amplifier circuit with bandwidth compensation as shown in FIG. 2.

With additional reference to FIG. 3, the differential input stage 114 of the OPAMP 112 includes a differential pair of input transistors 116*a* and 116*b* shown here, by example only, as n-channel MOSFET devices. A first conduction terminal (here, the drain) of each transistor 116*a*, 116*b* is coupled to a load circuit (formed by p-channel MOSFET current mirror circuit 122 coupled to a voltage supply node Vdd) and in a multistage implementation is further coupled to one or more additional amplification stages A (reference 124, for example, as shown in FIG. 4). A second conduction terminal (here, the source) is coupled, preferably connected, to a common node 118. A control terminal (here, the gate) of input transistor 116*a* forms the inverting (−) input of the OPAMP 112, and a control terminal (here, the gate) of input transistor 116*b* forms the noninverting (+) input of the OPAMP 112. A tail transistor 120 applies a bias (tail) current Ibias to the common node 118. The tail transistor 120 has a first conduction terminal (here, the drain) coupled, preferably connected, to the common node 118, and a second conduction terminal (here, the source) coupled, preferably connected, to the supply reference voltage node (ground). A control terminal (here, the gate) of the tail transistor 120 is controlled (as will be discussed in further detail below) to sink the bias current Ibias from the common node 118.

The bias current Ibias is generated by a bias current generator circuit 130. The bias current generator circuit 130 includes a current source 132 powered from a voltage supply node Vdd and configured to generate a proportional to absolute temperature (PTAT) reference current Iptat. PTAT current generator circuits are well-known to those skilled in the art. A resistor R3 is coupled, preferably connected, in series with the current source 132 at intermediate node 134.

In this configuration, the resistor R3 has a resistance substantially equal, preferably equal, to the sum of the resistances of the resistors R1 and R2 used to set the gain of the amplifier circuit 110: R3=R1+R2. Thus, the resistance of resistor R3 is, like that of resistors R1 and R2, temperature dependent. The resistor R3 may, for example, be circuit implemented by the series connection of a resistor matching resistor R1 (with a temperature dependent resistance $$R1_0(1 + C_1^T \Delta T))$$

and a resistor matching resistor R2 (with a temperature dependent resistance $$R2_0(1 + C_2^T \Delta T)).$$

The application of the current Iptat across the resistor R3 generates a reference voltage Vref at the intermediate node 134: Vref=Iptat*R3=Iptat (R1+R2). The reference voltage Vref is applied to the inverting (−) input of a differential amplifier circuit 140. In an embodiment, the differential amplifier circuit 140 comprises an operational amplifier (OPAMP). An output of the differential amplifier circuit 140 is coupled, preferably connected, to a control terminal (here, the gate) of an output transistor 142. The transistor 142 comprises a p-channel MOSFET with a first conduction terminal (here, the source) coupled, preferably connected, to the voltage supply node Vdd, and a second conduction terminal (here, the drain) coupled, preferably connected, to an intermediate node 144. The intermediate node 144 is coupled, preferably connected, in feedback to the noninverting (+) input of the differential amplifier circuit 140. A resistor R4 has a first terminal coupled, preferably connected, to the intermediate node 144 and a second terminal coupled, preferably connected, to the supply reference voltage node (ground).

The resistor R4 has a resistance substantially equal, preferably equal, to the resistance of the resistor R1 used in the gain setting network for the amplifier circuit 110. The resistor R4 may, for example, be circuit implemented by a resistor matching resistor R1 (with a temperature dependent resistance $$R1_0(1 + C_1^T \Delta T)).$$

The differential amplifier circuit 140, transistor 142 and resistor R4 form a voltage-to-current converter circuit that is configured to convert the reference voltage Vref that is applied to the inverting (−) input to a reference current Iref flowing through the series connection of transistor 142 and resistor R4, where:

$$Iref = \frac{Vref}{R4} = Iptat\frac{R1 + R2}{R1}.$$

The output of the differential amplifier circuit 140 is further coupled, preferably connected, to a control terminal (here, the gate) of a mirror transistor 150. The transistor 150 comprises a p-channel MOSFET with a first conduction terminal (here, the source) coupled, preferably connected, to the voltage supply node Vdd, and a second conduction terminal (here, the drain) coupled, preferably connected, to an intermediate node 152. The transistor 150 mirrors the current Iref that flows through transistor 142 to generate the mirrored current Iref. In an embodiment: Iref=Iref', where the transistors 142 and 150 have the same size (for example, are matching replicas of each other). In an alternative embodiment, there may be a scaling of the current Iref relative to the current Iref by sizing the transistor 150 larger or smaller than the transistor 142.

The mirrored current Iref flowing through transistor 150 is mirrored with a mirroring ratio of 1:k (where k is smaller, larger or equal 1, and non-zero) through a current mirror circuit formed by transistor 154 and tail transistor 120 to apply the bias current Ibias to the common node 118, where: Ibias=k*Iref'. The input transistor 154 of the current mirror circuit comprises an n-channel MOSFET having a first conduction terminal (here, the drain) coupled, preferably connected, to the intermediate node 152, and a second conduction terminal (here, the source) coupled, preferably connected, to the supply reference voltage node (ground). A control terminal (here, the gate) of transistor 154 is coupled, preferably connected, to the drain at intermediate node 152. The mirroring ratio of 1:k may be implemented, for example, by sizing the tail transistor 120, functioning as the output transistor of the current mirroring circuit) k times larger or smaller than input transistor 154 (where k is smaller, larger or equal 1, and non-zero).

Assuming that the differential pair of transistors 116*a*, 116*b* are biased in the subthreshold region, the transconductance of the input stage of the OPAMP 112 is given by:

$$g_{m1} = \frac{Iref}{\eta V_T} = \frac{Iptat}{\eta V_T}\frac{R1 + R2}{R1}$$

So, the bandwidth (unity gain-product) of the amplifier circuit 110 is given by:

$$\omega_0 = \frac{g_{m1}}{C_c}\beta = \frac{g_{m1}}{C_c}\frac{R1}{R1 + R2} = \frac{1}{C_c}\frac{Iptat}{\eta V_T}\frac{R1 + R2}{R1}\frac{R1}{R1 + R2} = \frac{1}{C_c}\frac{Iptat}{\eta V_T}$$

Where: $\eta$ is a technology dependent parameter; $g_{m1}$ is the small signal transconductance of the first (input) stage of the OPAMP 112, $C_c$ is the compensation capacitance, and $\beta$ is the feedback network amplification. In the context of a single stage amplifier, as shown in FIG. 3, the compensation capacitance $C_c$ is the load capacitance at the amplifier output node. In the context of a multi-stage amplifier, as shown in FIG. 4, the compensation capacitance $C_c$ is the compensation capacitance between stages, with a load capacitor $C_{load}$ coupled to the amplifier circuit output node.

Thus, with use of the current Iptat to generate the tail bias current Ibias of the input stage (with the differential pair of transistors 116*a*, 116*b*) of the OPAMP 112, the temperature dependence of the amplifier bandwidth introduced by the gain setting resistors R1 and R2 is compensated. Additionally, the PTAT behavior of the thermal voltage $$V_T = \frac{k_B T}{q}$$

is compensated as well. As a result, bandwidth of the amplifier circuit 110 is temperature independent, while the amplifier gain remains temperature dependent.

It will be noted that suitable design and layout criteria should be adopted in order to correctly match the behavior of the resistors R3 and R4 in the bias current generator circuit 130 to the resistors R1 and R2 which control the gain setting of the amplifier circuit 110. The generation of the tail bias current Ibias with a circuit 130 that uses the same types of resistors (R3, R4) as the resistors (R1, R2) used in the amplifier gain setting circuit ensures temperature and process spread compensation.

Thus, the (temperature dependent) resistance of resistor R3 is substantially equal, preferably equal, to a sum of the (temperature dependent) resistances of the resistors R1 and R2. Furthermore, the (temperature dependent) resistance of resistor R4 is substantially equal, preferably equal, to the (temperature dependent) resistance of the resistor R1.

Likewise, it will be noted that suitable design and layout criteria should be adopted in order to correctly match the behavior of the transistors 142, 150 and transistors 120, 154 in the current mirroring circuits that are used to generate the tail bias current Ibias from the reference current Iref. Additionally, further circuit precautions may be adopted to ensure correct (accurate) current mirroring. Such circuit precautions could include, for example, the use of cascode current mirroring circuits (as known to those skilled in the art).

The solution proposed herein for generating the tail bias current Ibias allows to reduce the effects of temperature variations and process spreads on the bandwidth of the amplifier circuit 110. In particular, the temperature stability requirement is unloaded from the design of the OPAMP 112 itself to instead the PTAT current generator 132.

Any residual temperature drift for the amplifier circuit 110 can be attributed to: temperature drift of the compensation capacitor $C_c$; and imperfections due to the definition of the subthreshold transconductance $g_m$.

With respect to the voltage-to-current converter circuit formed by the differential amplifier circuit 140, transistor 142 and resistor R4, it is noted that compensation of the Iref current generator feedback loop is easily implemented using a dominant pole compensation.

The solution presented herein offers a number of advantages including: the normal operation of the amplifier circuit with temperature dependent gain has been conjugated with the improved temperature and process spread insensitivity of the amplifier bandwidth; overdesign of the amplifier bandwidth is avoided through use of the tail bias current Ibias solution; the generation of the tail bias current Ibias utilizes a voltage-to-current converter circuit (formed by the differential amplifier circuit 140, transistor 142 and resistor R4) having a modest circuit complexity to achieve the design goal providing an amplifier bandwidth with temperature and process spread insensitivity.

While the circuit implementations shown in FIGS. 3 and 4 utilize a differential pair of input transistors 116*a*, 116*b* and tail current transistor 120 of n-channel MOSFET type, it will be understood that instead the input transistors 116*a*, 116*b* and tail current transistor 120 may instead be of p-channel MOSFET type (with the current mirror load circuit formed by n-channel MOSFETs). In the case of the p-channel MOSFET implementation, as an example, the current mirroring circuit functions performed by transistors 150 and 154 can be omitted. The p-channel tail current transistor may then have its control (here, gate) terminal coupled, preferably connected, to the output of the differential amplifier 140

(with a suitable 1:k scaling implementation by selective relative sizing of the transistors, where k is smaller, larger or equal 1, and non-zero).

As used herein, the phrase "substantially the same" or "substantially equal" is understood to mean same or equal to within a manufacturing tolerance of the process or to within a margin of +/−10%, preferably less than +/−5%.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

The invention claimed is:

1. An amplification circuit, comprising:
- an operational amplifier having a first input, a second input, and an output;
- an input resistor having a first resistance coupled to the first input;
- a feedback resistor having a second resistance coupled between the output and the first input;
- wherein the operational amplifier includes a differential input circuit coupled to the first and second inputs and biased by a bias current; and
- a bias current generator circuit comprising:
  - a proportional to absolute temperature (PTAT) current generator configured to generate a PTAT current;
  - a first resistor having a resistance substantially equal to a sum of the first and second resistances;
  - wherein the PTAT current is applied to the first resistor to generate a reference voltage;
  - a voltage-to-current converter circuit configured to convert the reference voltage to a reference current generated as a function of a second resistor having a resistance substantially equal to the first resistance; and
  - a mirroring circuit configured to mirror the reference current to generate said bias current.

2. The amplification circuit of claim 1, wherein a mirroring ratio of the reference current to said bias current is 1:k, where k is smaller, larger or equal to 1, and non-zero.

3. The amplification circuit of claim 1, wherein the voltage-to-current converter circuit comprises:
- a differential amplifier having a first input, a second input, and an output;
- wherein the first input of the differential amplifier is coupled to receive the reference voltage;
- an output transistor having a control terminal coupled to the output of the differential amplifier;
- a feedback connection between a conduction terminal of the output transistor and the second input of the differential amplifier; and
- wherein said second resistor is coupled between the conduction terminal of the output transistor and a supply reference node, with said reference current flowing through said second resistor.

4. A circuit, comprising:
- an amplifier circuit having a gain setting network formed by an input resistor and a feedback resistor;
- wherein said amplifier circuit includes a differential input circuit that is tail biased by a bias current; and
- a bias current generator circuit comprising:
  - a proportional to absolute temperature (PTAT) current generator coupled in series with a first resistor to generate a reference voltage;
  - wherein the first resistor has a temperature dependent resistance substantially equal to a sum of temperature dependent resistances of the input and feedback resistors;
  - a voltage-to-current converter circuit configured to convert the reference voltage to a reference current applied across a second resistor;
  - wherein the second resistor has a temperature dependent resistance substantially equal to the temperature dependent resistance of the input resistor; and
  - a mirroring circuit configured to mirror the reference current to generate said bias current.

5. The circuit of claim 4, wherein a mirroring ratio of the reference current to said bias current is 1:k, where k is smaller, larger or equal to 1, and non-zero.

6. The circuit of claim 4, wherein the voltage-to-current converter circuit comprises:
- a differential amplifier coupled to receive the reference voltage;
- an output transistor having a control terminal coupled to an output of the differential amplifier;
- a feedback connection between a conduction terminal of the output transistor and an input of the differential amplifier; and
- wherein said second resistor is coupled between the conduction terminal of the output transistor and a supply reference node, with said reference current flowing through said second resistor.

7. A circuit, comprising:
- an operational amplifier (OPAMP) with a gain setting network formed by an input resistor with a first resistance R1 and a feedback resistor with a second resistance R2;
- wherein said OPAMP has a bandwidth set as a function of a transconductance of an input stage of said OPAMP multiplied by a first factor equal to $$\frac{R1}{R1+R2}$$

as set by said gain setting network;
- wherein the transconductance is dependent on a tail current configured to bias the input stage of said OPAMP; and
- a bias current generator circuit configured to generate said tail current as a function of a second factor substantially equal to $$\frac{R1+R2}{R1}.$$

8. The circuit of claim 7, wherein said second factor substantially equal to $$\frac{R1+R2}{R1}$$

is set by a first resistor of the bias current generator circuit having a third resistance R3 substantially equal to a sum of the first resistance R1 and second resistance R2 and a second resistor of the bias current generator circuit having a fourth resistance R4 substantially equal to the first resistance R1.

9. The circuit of claim 7, wherein said bias current generator circuit comprises:

a proportional to absolute temperature (PTAT) current generator coupled in series with a first resistor to generate a reference voltage;

wherein the first resistor has a third resistance R3 substantially equal to a sum of the first resistance R1 and second resistance R2;

a voltage-to-current converter circuit configured to convert the reference voltage to a reference current applied across a second resistor;

wherein the second resistor has a fourth resistance R4 substantially equal to the first resistance R1; and a mirroring circuit configured to mirror the reference current to generate said tail current.

10. The circuit of claim 9, wherein a mirroring ratio of the reference current to said tail current is 1:k, where k is smaller, larger or equal to 1, and non-zero.

* * * * *